United States Patent [19]
Heo

[11] Patent Number: 5,926,733
[45] Date of Patent: Jul. 20, 1999

[54] METAL LAYER PATTERNS OF A SEMICONDUCTOR DEVICE AND A METHOD FOR FORMING THE SAME

[75] Inventor: Yeon Cheol Heo, Kyoungkido, Rep. of Korea

[73] Assignee: Hyundai Electronics Industries Co., Ltd., Kyoungkido, Rep. of Korea

[21] Appl. No.: 08/832,349

[22] Filed: Apr. 2, 1997

[30] Foreign Application Priority Data

Apr. 26, 1996 [KR]  Rep. of Korea ................ 96-13191

[51] Int. Cl.⁶ ................. H01L 23/48; H01L 23/52; H01L 29/40
[52] U.S. Cl. ................. 438/622; 438/625; 438/928; 257/773
[58] Field of Search .................. 257/773; 438/622, 438/625, 928, 669, 670, 671

[56] References Cited

U.S. PATENT DOCUMENTS

| | | | |
|---|---|---|---|
| 5,032,890 | 7/1991 | Ushiku et al. | 257/211 |
| 5,534,728 | 7/1996 | Kim et al. | 257/692 |
| 5,663,599 | 9/1997 | Lur | 257/750 |

FOREIGN PATENT DOCUMENTS

| | | |
|---|---|---|
| 1-239873 | 9/1989 | Japan . |
| 1-295443 | 11/1989 | Japan . |
| 4-307958 | 10/1992 | Japan . |
| 6-216249 | 8/1994 | Japan . |

Primary Examiner—Mahshid Saadat
Assistant Examiner—Jhihan B. Clark
Attorney, Agent, or Firm—Jacobson, Price, Holman & Stern, PLLC

[57] ABSTRACT

The present invention provides metal layer patterns of a semiconductor device which reduces the effect of the current induced by the plasma in the etching process and prevents the device characteristics from being deteriorated, by a method for forming a photomask to pattern metal layers of a semiconductor device including the steps of: designing base metal line patterns, the base metal line patterns being required for the proper operation of the semiconductor device; expanding the base metal line patterns outwardly by an expanding distance; designing a dummy metal line patterns by reversing the expanded base metal line patterns; and designing a final metal line patterns of the semiconductor device by combining the base metal line patterns and the dummy metal line patterns.

6 Claims, 9 Drawing Sheets

METAL LAYER PATTERNS OF A SEMICONDUCTOR DEVICE AND A METHOD FOR FORMING THE SAME

BACKGROUND OF THE INVENTION

1. Field of the Invention

This invention relates to metal layer patterns of a semiconductor device and a method for forming the same, and more particularly to metal layer patterns of a semiconductor and a method for forming a photomask to pattern metal layers of a semiconductor device which prevents the characteristics of the device from being deteriorated during the etching process of the metal layer.

2. Description of the Prior Art

Generally, the dry etching process using plasma is performed by the strong reactive characteristics of ions in the plasma, which are accelerated by the electrical field formed between the electrodes of the chamber, with the etched layer. The layer is etched by the reaction of the accelerated ions and the atoms of the layer.

The dry etching process using plasma is useful for manufacturing high density semiconductor devices, for example 1 Giga DRAM. Therefore, the dry etching process using plasma is becoming more important in the manufacturing of high density semiconductor devices. Also, the dry etching process is frequently used to etch the metal layers of the semiconductor devices.

In the conventional dry etching process of the metal layer, the metal layer itself is used as an electrode to flow electrical current induced by the plasma.

Referring to the drawings, FIG. 1A is a schematic cross sectional view of a conventional semiconductor device. As shown in the FIG. 1, the conventional semiconductor device Includes a semiconductor substrate 1, a gate oxide layer 2, a field oxide layer 3, a gate electrode 4, an impurity area 5, an interlayer insulating layer 6 and a metal layer 7. Note that the impurity area 5 is not a source/drain area of the transistor of the gate electrode 4, and forms an electrical contact with the metal layer 7.

The electrical contact of the metal layer 7 with the impurity area 5 is used to flow the above mentioned electrical current, which is induced by the plasma in the dry etching process for patterning the metal layer 7, to the silicon substrate 1.

FIG. 1B is a layout diagram of the photomask for forming the conventional metal layer 11 of the semiconductor device. As shown in the FIG. 1B, the metal layer 11 has different spacings between patterns depending on the location of the patterns.

However, the above mentioned conventional metal layer 11 of semiconductor devices has the problem of loading effect clue to the different spacings. The loading effect results in a different etch rate, depending on the locations of the etched patterns. Therefore, in case the etching process is controlled with the lowest etch rate, over-etched patterns are produced and the gate oxide under the over-etched patterns are deteriorated. Furthermore, the over-etching will cause a greater current to be induced by the plasma and the needed contact area to flow the current to the substrate 1 will be greater.

SUMMARY OF THE INVENTION

Therefore, the present invention has been made in view of the above mentioned problems, and an object of the present invention is to provide metal layer patterns of semiconductor and a method for forming a photomask to pattern metal layers of a semiconductor device which makes a smaller plasma current in the etching process and prevents the device characteristics from being deteriorated.

In accordance with the present invention, there is disclosed a semiconductor device including: a base metal line patterns on an insulating layer, said base metal line patterns being required for proper operation of said semiconductor device; and dummy metal line patterns located on the rest area of said insulating layer where there is no base metal line pattern, wherein said base metal line patterns and said dummy metal line patterns maintain a uniform spacing.

Also, in another aspect of the present invention, there is disclosed a method for forming a photomask to pattern metal layers of a semiconductor device, the method comprising the steps of: designing base metal line patterns, said base metal line patterns being required for proper operation of said semiconductor device; expanding said base metal line patterns outwardly by an expanding distance; designing a dummy metal line pattern by reversing said expanded base metal line patterns; and designing metal line patterns of said semiconductor device by merging said base metal line patterns and said dummy metal line patterns.

Also, in another aspect of the present invention, there is disclosed a method for forming a photomask to pattern metal layers of a semiconductor device, the method comprising the steps of: designing base metal line patterns, said base metal line patterns being required for proper operation of said semiconductor device; reversing said base metal line patterns; designing dummy metal line patterns by contracting said reversed base metal line patterns inwardly by a contracting distance; and designing metal line patterns of said semiconductor device by merging said base metal line patterns and said dummy metal line patterns.

BRIEF DESCRIPTION OF THE DRAWINGS

These and other objects, features and advantages of the present invention will more fully apparent from the description of preferred embodiments with reference to the accompanying drawings, in which.

DETAILED DESCRIPTION OF THE PREFERRED EMBODIMENTS

A detailed description of an embodiment according to the present invention will be given below with reference to FIGS. 2A to 2D.

Figure 1A:
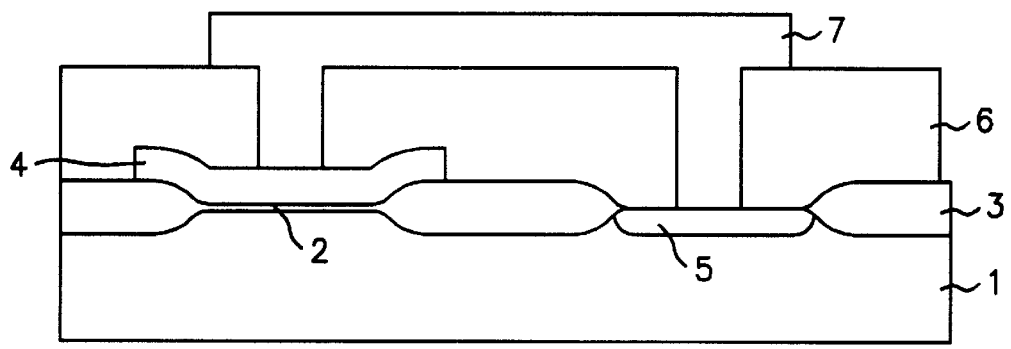
FIG. 1A is a schematic cross sectional view showing a conventional semiconductor device.
Figure 1B:
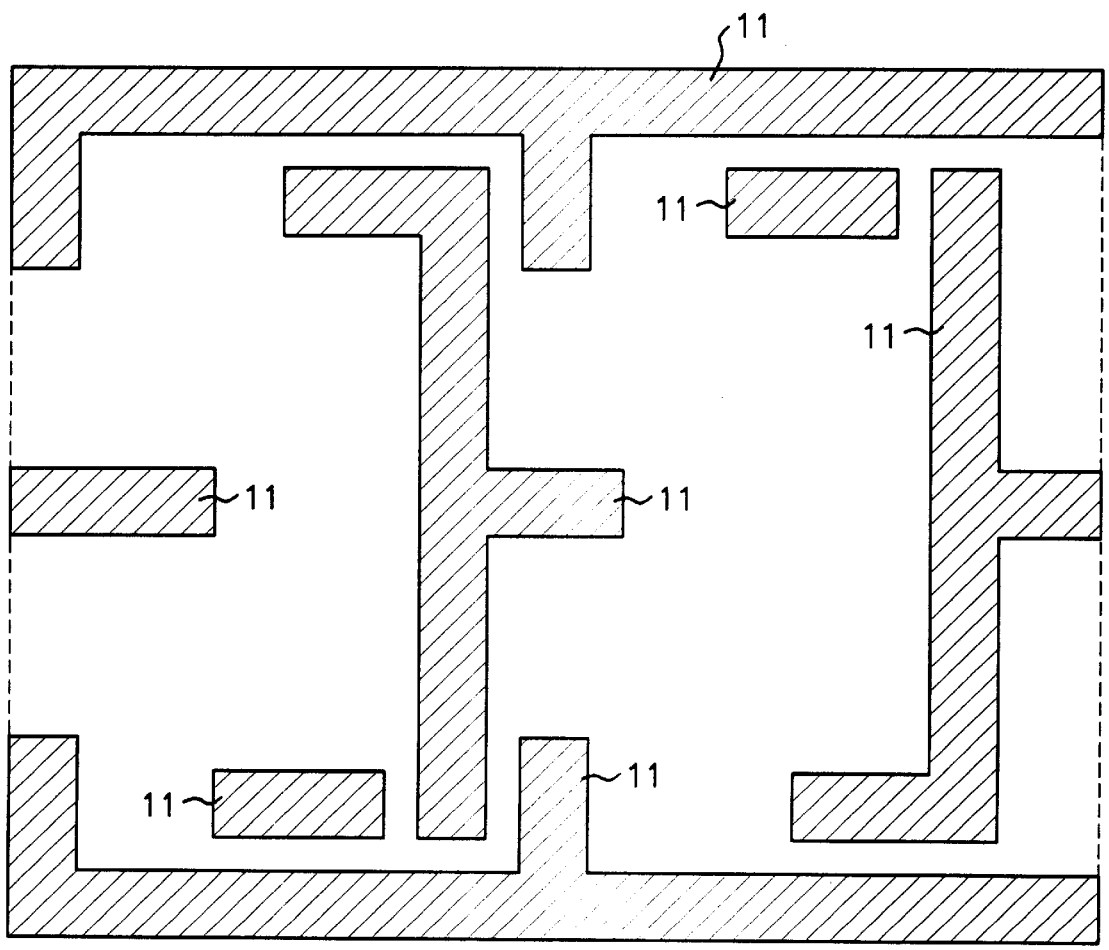
FIG. 1B is a layout diagram of a conventional photomask to pattern metal layer of the semiconductor device in FIG. 1A.
Figure 2A:
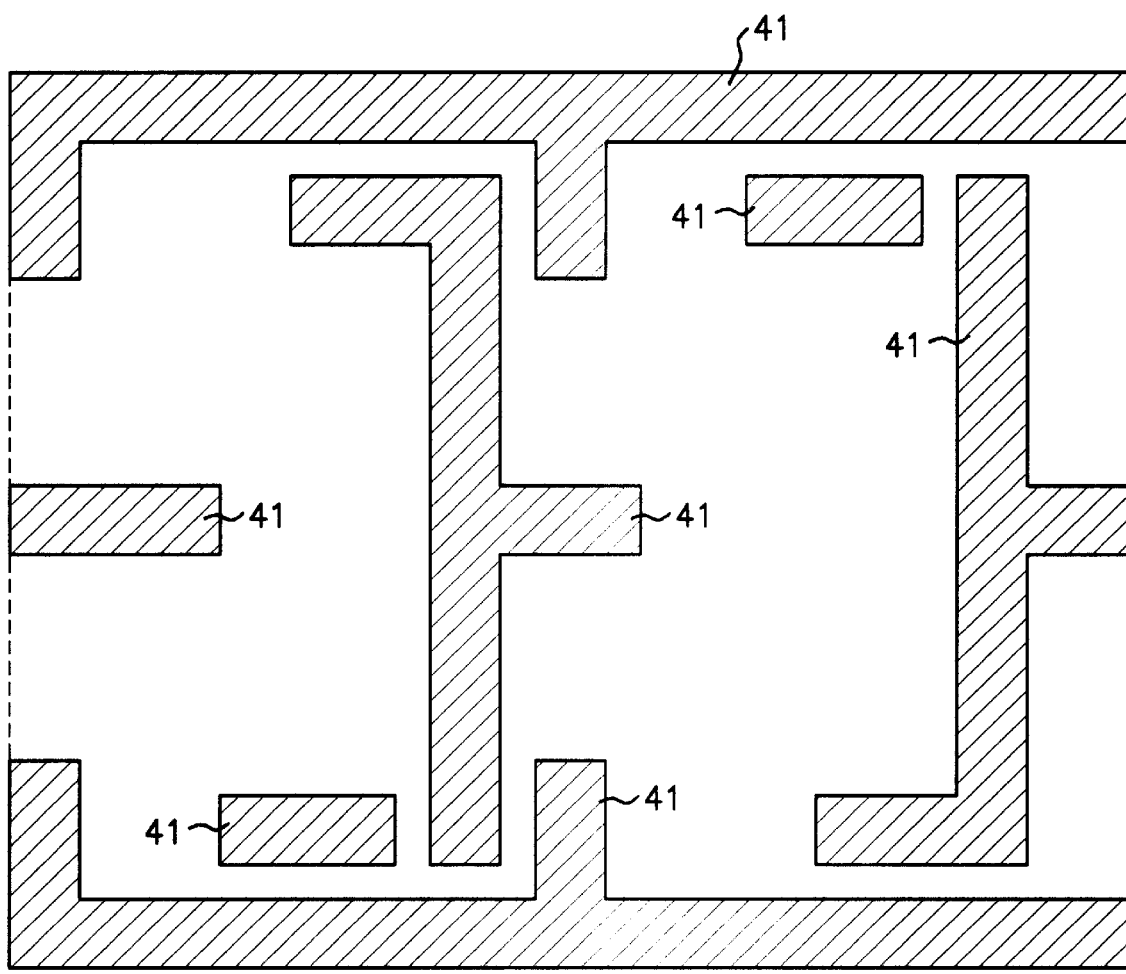
FIGS. 2A to 2D are the layout diagrams illustrating the steps of the method of forming a photomask to pattern metal layers in accordance with this invention.

First, referring to FIG. 2A, base metal line patterns 41 are designed for the proper operation of the semiconductor device and the proper operation of the device is sufficiently guaranteed by the base metal line patterns 41. Note that the designing of the base metal line patterns 41 can be performed by the conventional design tools, such as CAD (computer-aided design).

Figure 2B:
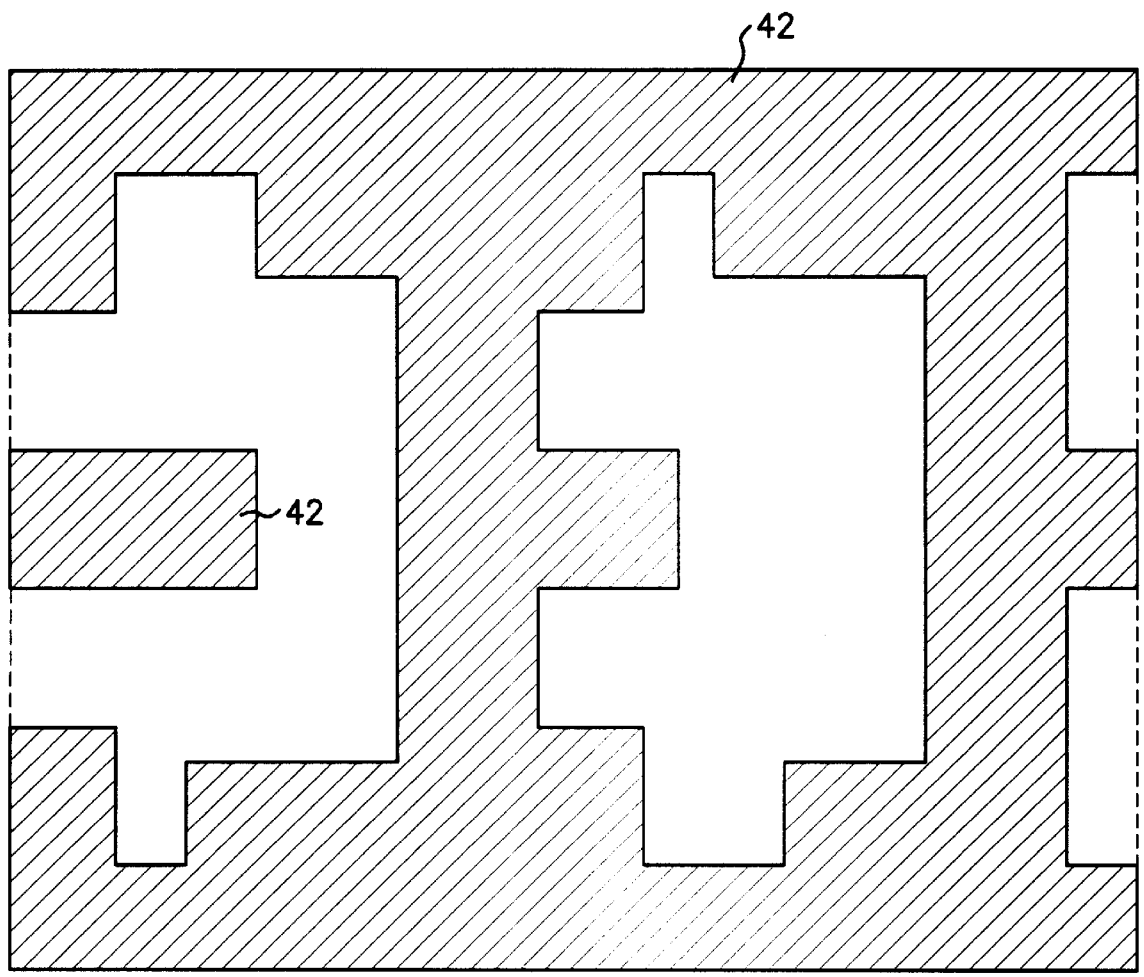

Next, referring to FIG. 2B, the base metal line patterns 41 are expanded outwardly by an expanding distance, which is not longer than a half of the minimum spacing between the base metal line patterns. Preferably, the expanding distance is about from 0.2 µm to 1.0 µm. As shown in the FIG. 2B, the base metal line there are no spacings which are smaller than twice of the distance of the above mentioned expanding distance.

Figure 2C:
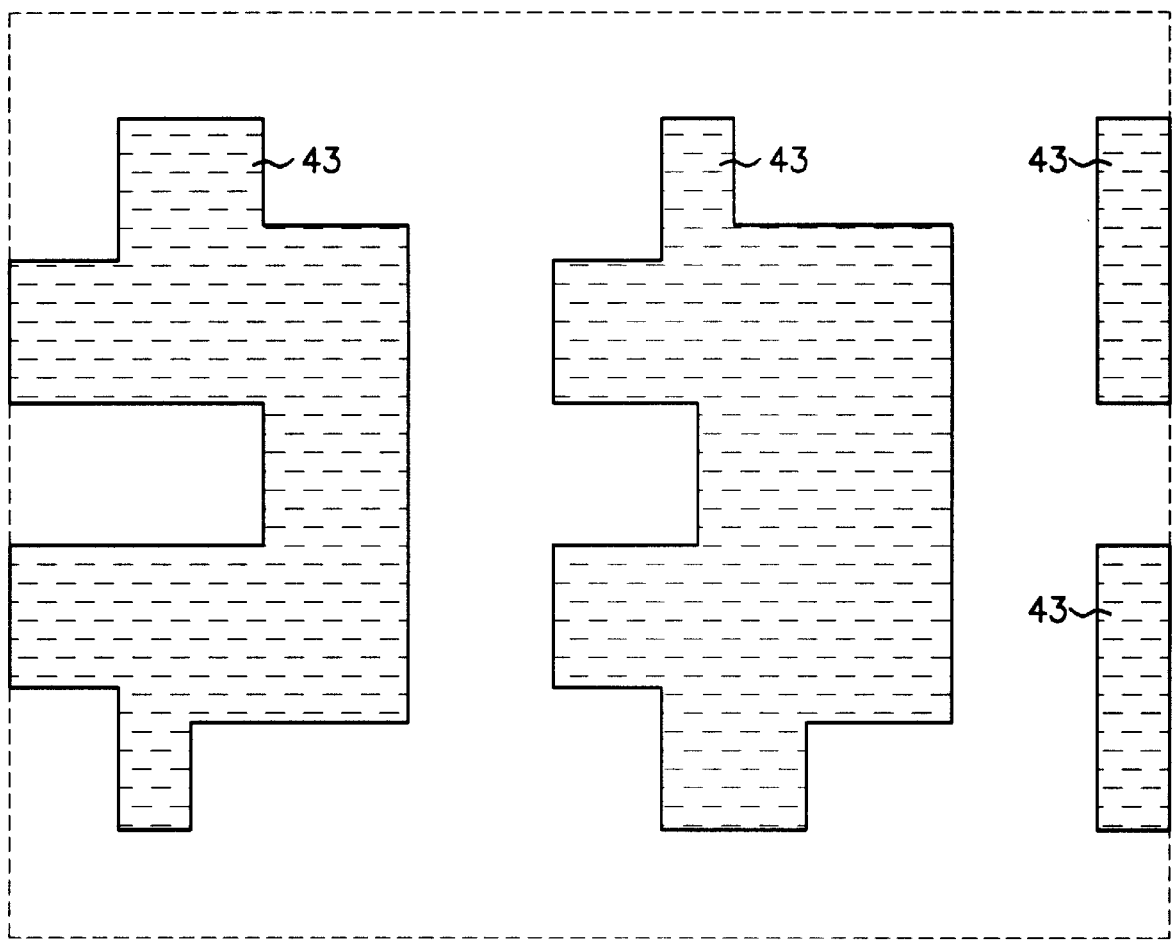

Next, referring to FIG. 2C, the expanded metal line patterns 42 are reversed to generate dummy metal line patterns 43. As shown in the FIG. 2C, the dummy metal line patterns 43 are originally the blank space in FIG. 2B.

Figure 2D:
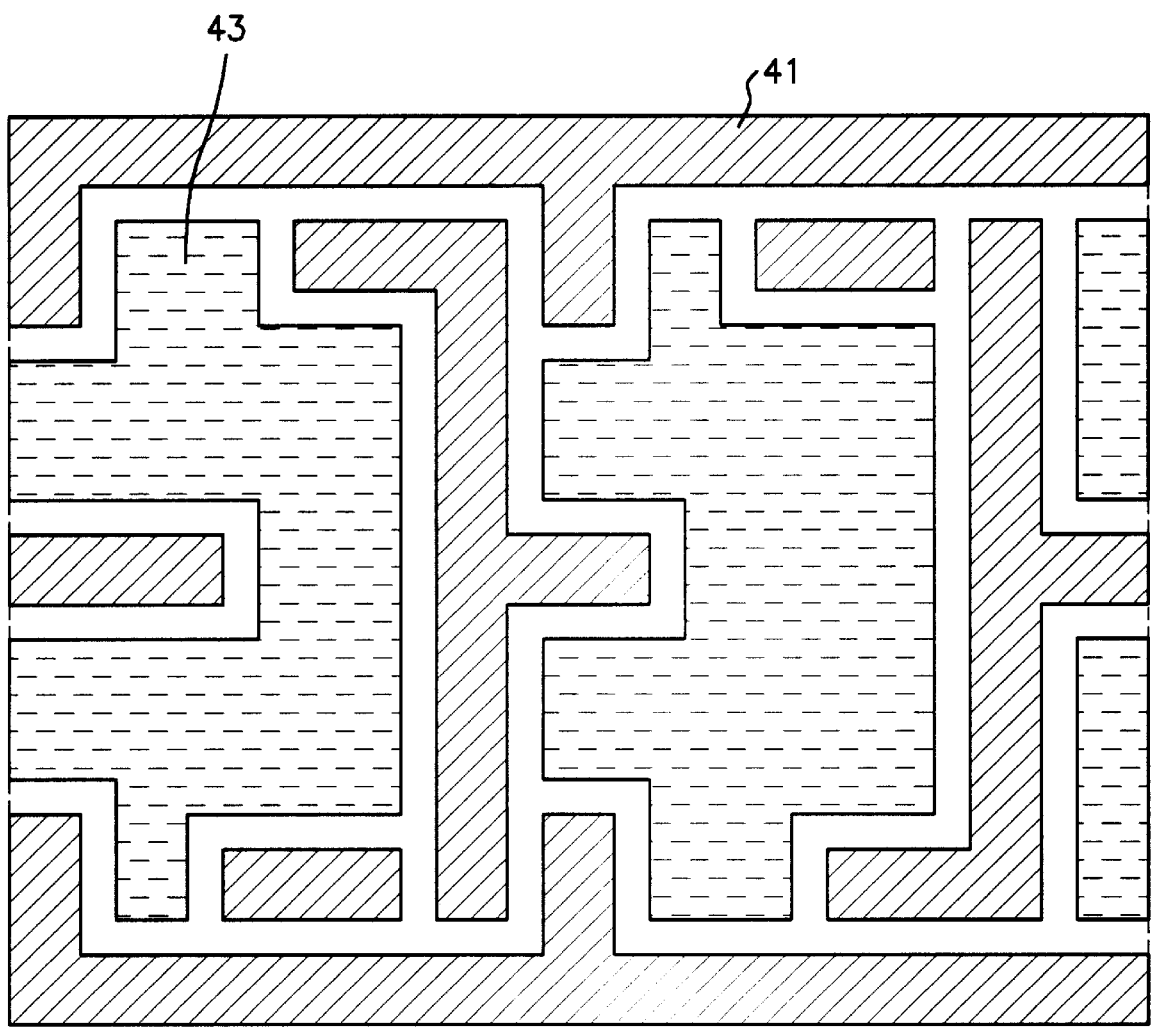

Finally, referring to FIG. 2D, metal line patterns of a photomask are designed by combining the base metal line patterns 41 and the dummy metal line patterns 43. As shown in the FIG. 2D, the spacings between the patterns (41, 43) are uniform at every point of the final metal line patterns.

Now, another embodiment according to the present invention will be described below with reference to FIGS. 3A to 3D.

Figure 3A:
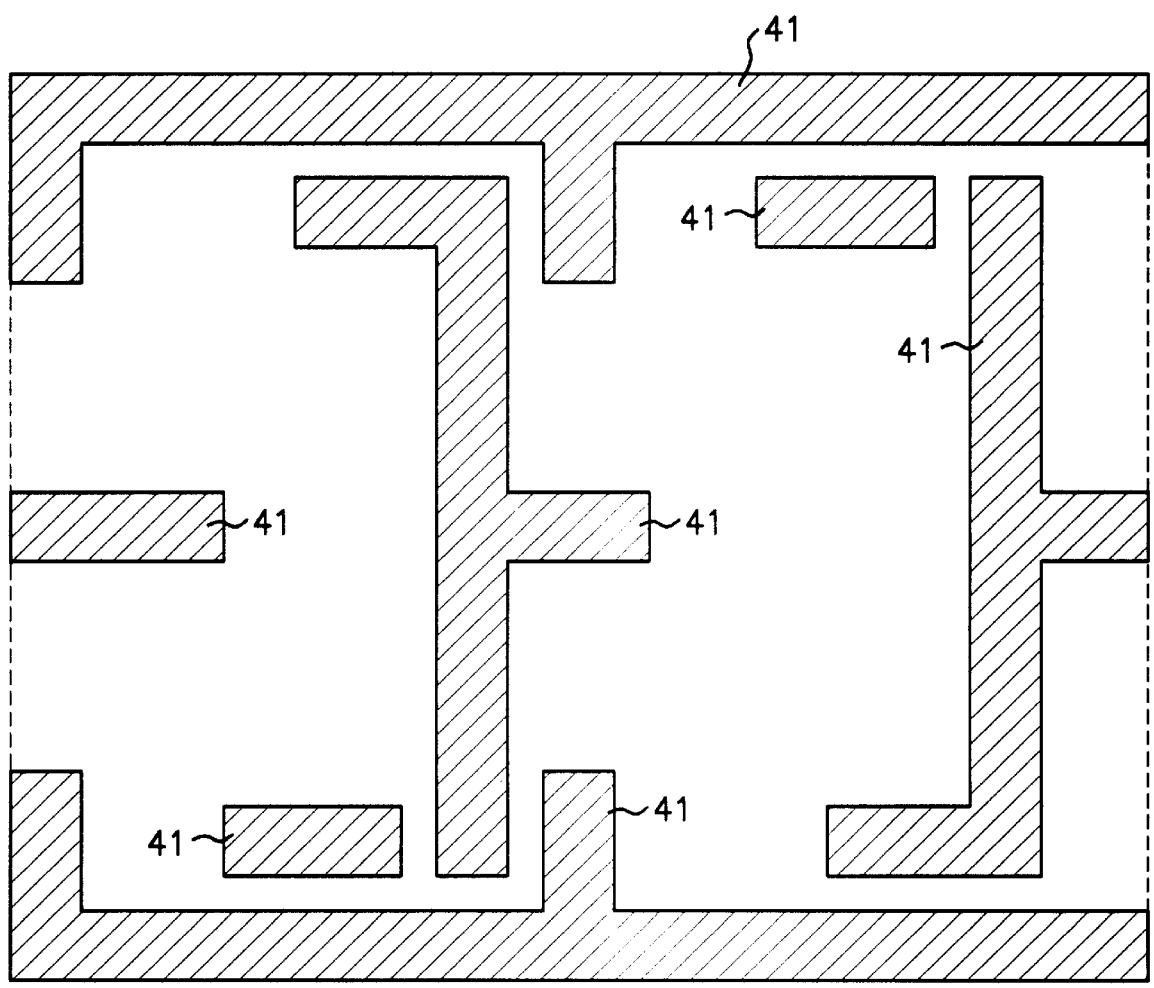
FIGS. 3A to 3D are the layout diagrams illustrating the steps of another method of forming a photomask to pattern metal layers in accordance with this invention.

First, referring to FIG. 3A, as in FIG. 2A, the base metal line patterns 41 are designed for the proper operation of the semiconductor device.

Figure 3B:
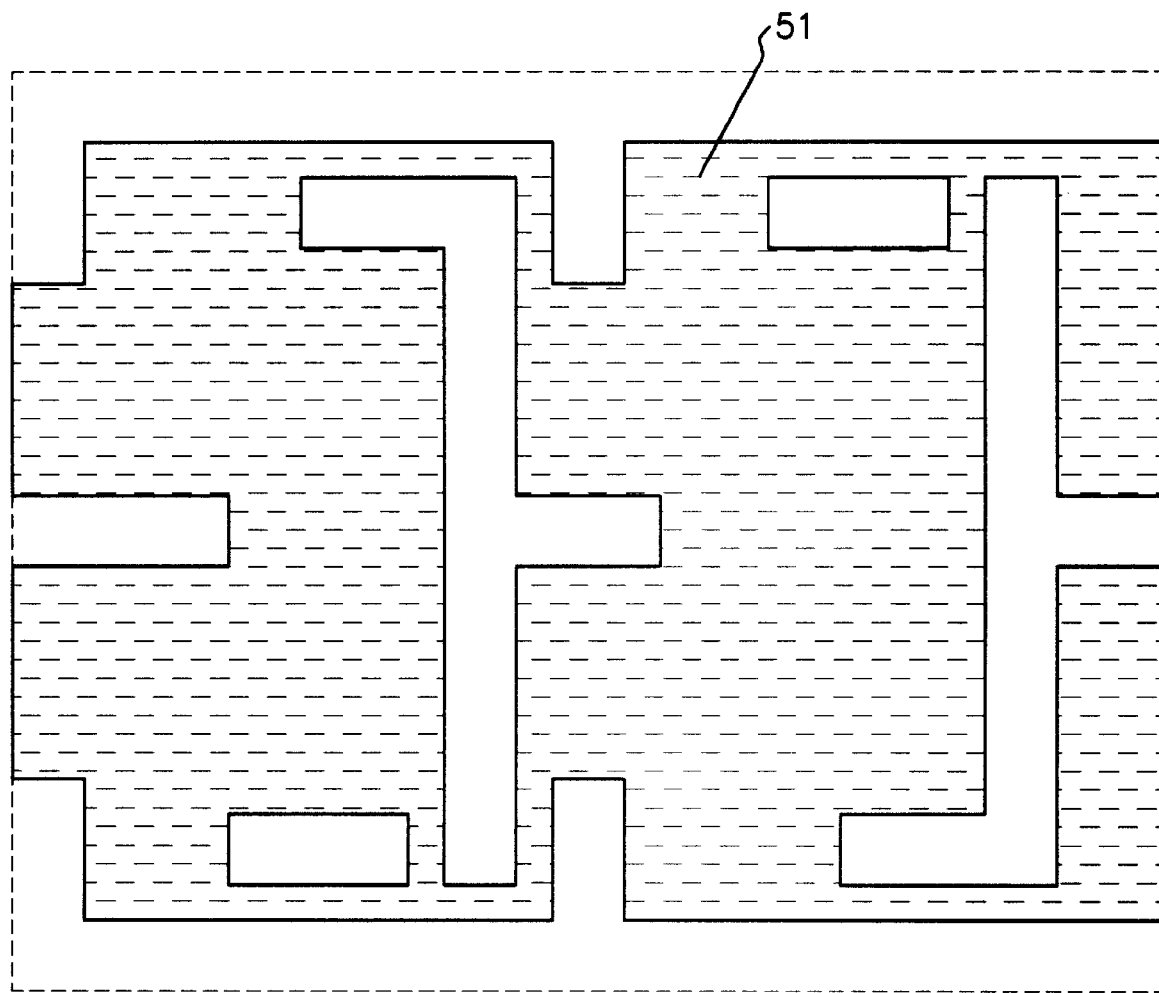

Next, referring to FIG. 3B, the base metal line patterns 41 are reversed to generate reversed metal line patterns 51. As shown in the FIG. 3B, the reversed metal line patterns 51 are originally the blank space in FIG. 3A.

Figure 3C:
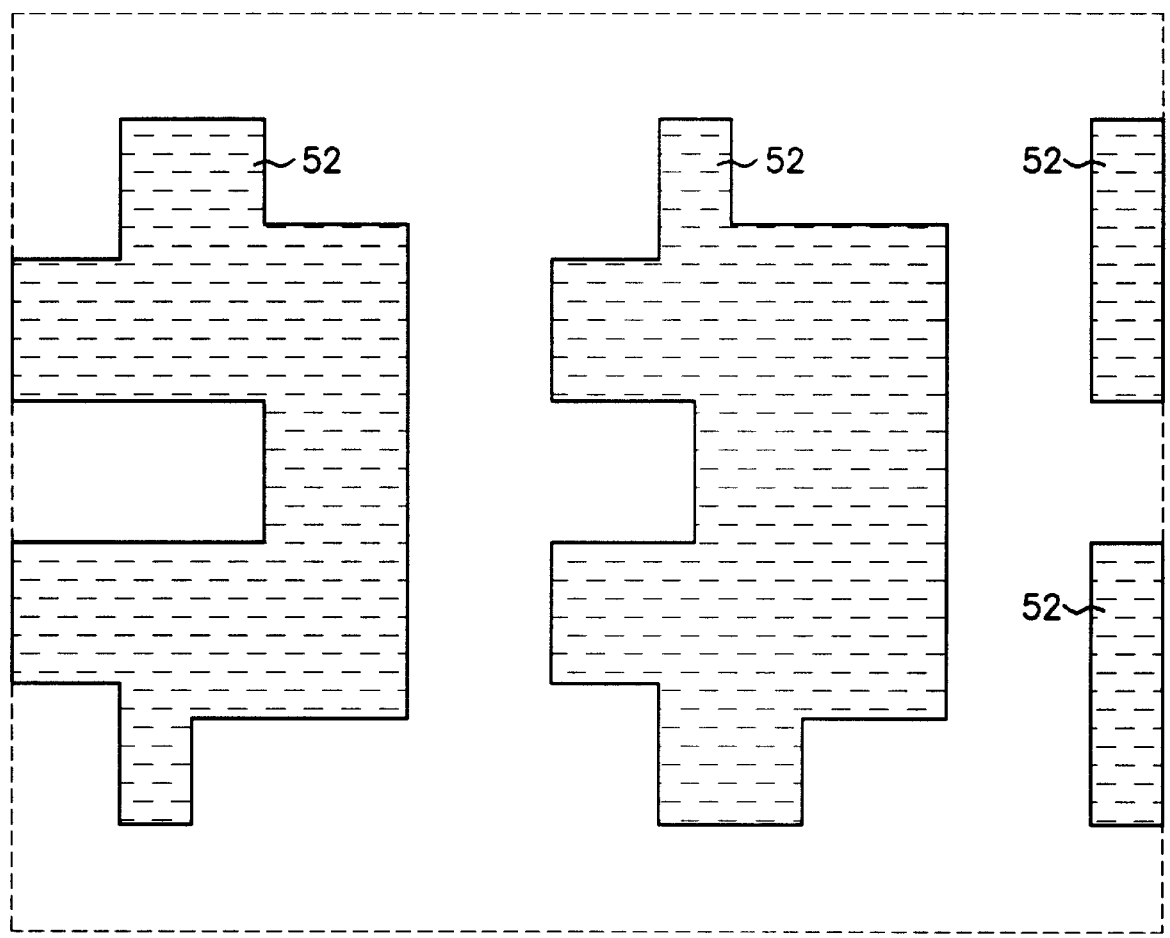

Next, referring to FIG. 3C, the reversed metal line patterns 51 are contracted inwardly by an contracting distance, which is not longer than a half of the narrowest width of the reversed metal line patterns 51. Preferably, the contracting distance is about from 0.2 µm to 1.0 µm. Therefore, The dummy metal line patterns 52 in FIG. 3C are taken by contracting the reversed metal line patterns 51, and there is no dummy metal line patterns 52, which are smaller than twice of the distance of the above mentioned contracting distance. In fact, the dummy metal line patterns 52 are the same patterns as the dummy metal line patterns 43 in the FIG. 2C.

Figure 3D:
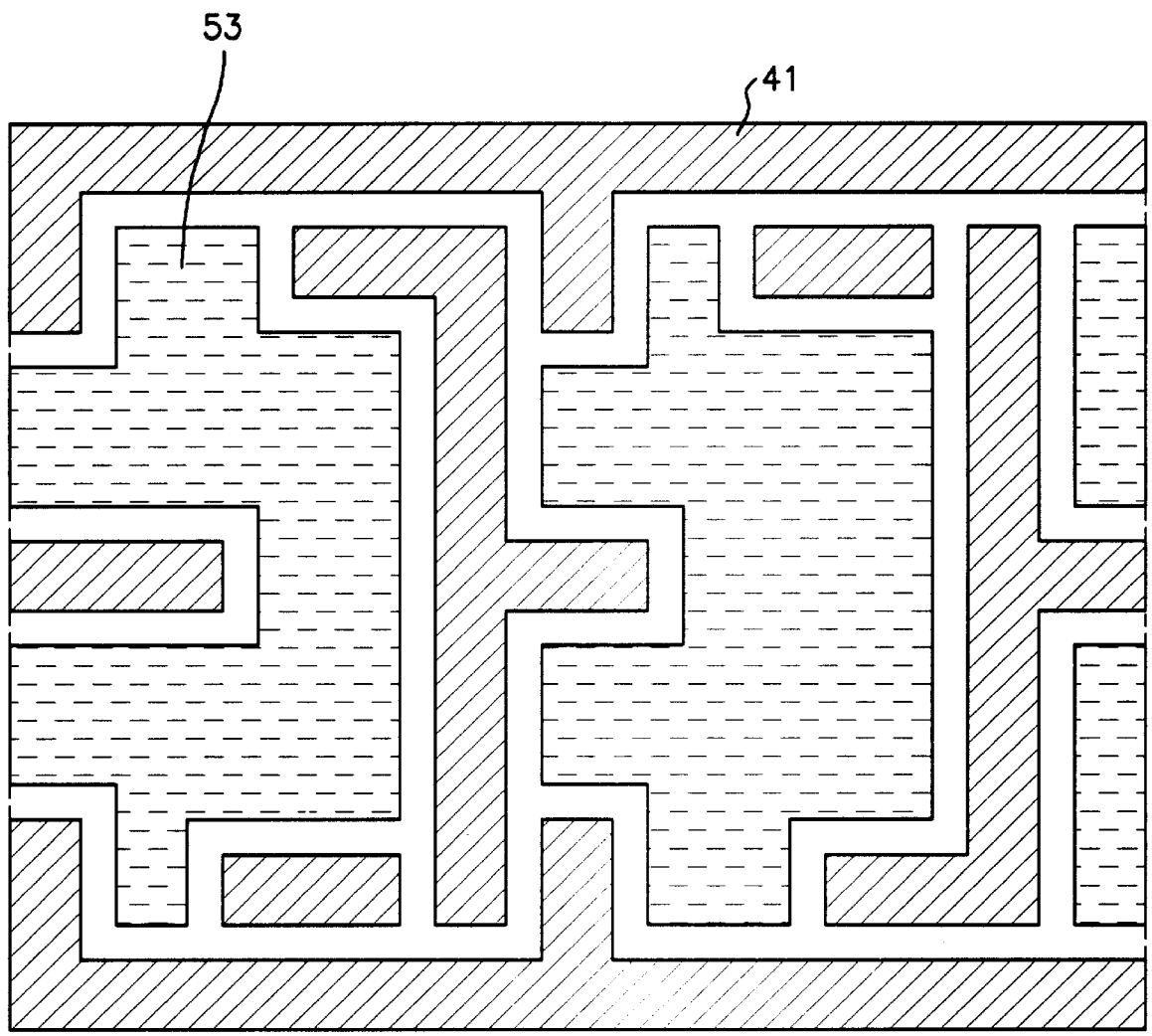

Finally, referring to FIG. 3D, the metal line patterns of a photomask are designed by merging the base metal line patterns 41 and the dummy metal line patterns 52. As shown in the FIG. 3D, the spacings between patterns(41,52) are uniform at every point of the final metal line patterns.

As described above, according to the present invention, the spacings between the metal line patterns can be made uniform. Also, a uniform etch rate can be achieved during the etching process of the metal layer. Therefore, the over-etching and the deterioration of the under layers can be effectively removed. Furthermore, the current induced by the plasma can be effectively restricted to a limited value.

Also, note that the above mentioned layout procedure of the present invention can be performed by an automated computer system once the base metal line patterns 41 are given.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A method for forming a photomask to pattern metal layers of a semiconductor device, the method comprising the steps of:

designing a base metal line patterns, said base metal line patterns being required for proper operation of said semiconductor device;

expanding said base metal line patterns outwardly by an expanding distance;

designing dummy metal line patterns by reversing said expanded base metal line patterns; and designing metal line patterns of said semiconductor device by merging said base metal line patterns and said dummy metal line patterns.

2. A method according to claim 1, the expanding distance is not longer than a half of the minimum spacing between said base metal line patterns.

3. A method according to claim 2, wherein said expanding distance is about from 0.2 µm to 1.0 µm.

4. A method for forming a photomask to pattern metal layers of a semiconductor device, the method comprising the steps of:

designing base metal line patterns, said base metal line patterns being required for proper operation of said semiconductor device;

reversing said base metal line patterns;

designing dummy metal line patterns by contracting said reversed base metal line patterns inwardly by a contracting distance; and designing metal line patterns of said semiconductor device by merging said base metal line patterns and said dummy metal line patterns.

5. A method according to claimed 4, the contracting distance is not longer than a half of the narrowest width of said reversed base metal line pattern.

6. A method according to in claim 5, wherein said contracting distance is about from 0.2 µm to 1.0 µm.

* * * * *